United States Patent [19]

Yamaguchi et al.

[11] Patent Number: 5,100,814
[45] Date of Patent: Mar. 31, 1992

[54] SEMICONDUCTOR DEVICE AND METHOD OF MANUFACTURING THE SAME

[75] Inventors: Hiroshi Yamaguchi; Masao Yoshizawa; Kazumasa Satsuma; Takeshi Kida; Tomohide Terashima, all of Itami, Japan

[73] Assignee: Mitsubishi Denki Kabushiki Kaisha, Tokyo, Japan

[21] Appl. No.: 628,007

[22] Filed: Dec. 17, 1990

Related U.S. Application Data

[62] Division of Ser. No. 373,585, Jun. 30, 1989, abandoned.

[30] Foreign Application Priority Data

Feb. 8, 1989 [JP] Japan ................................. 1-28885

[51] Int. Cl.$^5$ ............................................. H01L 21/76
[52] U.S. Cl. ...................................... 437/31; 437/62; 437/974; 357/49; 148/DIG. 135
[58] Field of Search .................... 437/62, 31, 67, 68, 437/974; 148/DIG. 135

[56] References Cited

U.S. PATENT DOCUMENTS 4,692,784  9/1987  Negoro ................................. 357/49

FOREIGN PATENT DOCUMENTS 0218747 12/1984 Japan ..................................... 437/62
59-218747 12/1984 Japan .

Primary Examiner—Robert Kunemund
Assistant Examiner—Long Pham
Attorney, Agent, or Firm—Oblon, Spivak, McClelland, Maier & Neustadt

[57] ABSTRACT

First and second semiconductor elements are formed in first and second semiconductor element forming regions which have the same thickness, include first and second semiconductor layers and are separated with dielectric isolation from each other. The thickness of the first semiconductor layer is made different between the first and second semiconductor element forming regions, so that the thickness of the second semiconductor layer becomes different between the first and second semiconductor element forming regions. Thus, the semiconductor device may have the semiconductor elements which have second semiconductor layers with different thicknesses in accordance with desired electrical characteristics for each of the semiconductor elements formed in the first and second semiconductor element forming regions, to complement a semiconductor device having the semiconductor elements each of which has independent optimum electrical characteristics.

6 Claims, 10 Drawing Sheets

SEMICONDUCTOR DEVICE AND METHOD OF MANUFACTURING THE SAME

This is a division of application Ser. No. 07/373,585, filed on June 30, 1989, now abandoned.

BACKGROUND OF THE INVENTION

1. Field of the Invention

The present invention relates to a semiconductor device having a plurality of semiconductor elements isolated by dielectric isolation and relates to a method of manufacturing the same.

2. Description of the Background Art

FIG. 1 is a sectional view showing a conventional semiconductor device of an isolation type composite element structure which has a plurality of semiconductor elements isolated by dielectric isolation. As shown in FIG. 1, the semiconductor device comprises an insulation gate type field effect transistor 10A and a junction type bipolar transistor 10B on the upper portion of an $n^-$ polysilicon substrate 1. The transistors 10A, 10B are isolated by an insulation film 2 from each other. A prescribed thickness of $n^+$ layer 3 is formed on the insulation film 2, and an $n^-$ layer 4 is formed on the $n^+$ layer 3.

In a region for element formation (referred to as an "island" below) in which the field effect transistor 10A is formed, a p type well region 5 is formed on the upper portion of the $n^-$ layer 4. An $n^+$ source region 6 is selectively formed on the upper surface of the p type well region 5.

On the upper surface of the p type well region 5 between the surfaces of the $n^-$ layer 4 and $n^+$ source region 6, polysilicon gates 8 are formed with gate oxide film 7 interposed therebetween. Drain electrodes 9 are formed on the surfaces of the $n^+$ layer 3. A source electrode 11 is formed on parts of the surfaces of the $n^+$ source regions 6 and the surface of the p type well region 5 between the $n^+$ source regions 6. Gate electrodes 12 are formed on the polysilicon gate 8. These electrodes 9, 11 and 12 are insulated from each other by a passivation film 18.

In an island of the bipolar transistor 10B, a p type base region 13 is formed on the upper portion of the $n^-$ layer 4. An $n^+$ emitter region 14 is formed on a part of the surface of the p type base region 13. An emitter electrode 15 is formed on the $n^+$ emitter region 14. A base electrode 16 is formed on the p type base region 13. A collector electrode 17 is formed on the $n^+$ layer 3. These electrodes 15 to 17 are insulated from each other by a passivation film 18.

FIGS. 2A to 2F are sectional views showing steps for manufacturing islands in the semiconductor device shown in FIG. 1. The manufacturing steps will be described with reference to these figures.

An oxide layer 22 is deposited on the surface of an $n^-$ substrate 21 of monocrystal and patterned as shown in FIG. 2A. The $n^-$ substrate 21 is anisotropically etched to form V-shaped grooves 23 by using the patterned resist layer 22 as a mask, as shown in FIG. 2B. A distance l between grooves 23 defines a width of each island.

After removing the oxide film 22, n-type impurities are diffused on the surfaces of the $n^-$ substrate 21 as well as the grooves 23 to form an $n^+$ layer 3 as shown in FIG. 2C. The $n^+$ layer 3 is treated with hydrofluoric acid contained chemical (e.g., a phosphorous glass layer or the like is removed from the surface of the $n^+$ layer 3) in a pretreatment, and then an insulation film 2 such as a thermal oxide film is formed on the $n^+$ layer 3 as shown in FIG. 2D.

An $n^-$ polysilicon layer 24 is deposited on the insulation film 2 by epitaxial growth technology as shown in FIG. 2E. Then, the bottom surface of the $n^-$ substrate 21 is polished to expose the insulation film 2 and the $n^+$ layer 3 on the bottom surface of the $n^-$ substrate 21.

Turning the $n^-$ substrate 21 upside down results in a plurality of islands 25 shown in FIG. 2F. The $n^-$ polysilicon layer 24 corresponds to the $n^-$ polysilicon substrate 1 in FIG. 1. Remaining parts of the $n^-$ substrate 21 corresponds to the $n^-$ layer 4 in FIG. 1. The islands 25 are insulated from each other by the insulation film 2. The field effect transistor 10A and the bipolar transistor 10B shown in FIG. 1 are formed in the islands 25 thus obtained.

When the source electrode 11 of the field effect transistor 10A is set at a prescribed potential and a prescribed voltage is applied to the gate electrode 12, a channel region 5a, which is defined in the surface of the p type well region 5 under the polysilicon gate 8, is inverted into an n type to form a channel. As a result, the field effect transistor 10A becomes conductive, so that the drain current flows across the drain electrode 9 and the source electrode 11.

An ON-state resistance is the sum mainly of resistance on the channel region 5a and resistance on the $n^-$ layer 4. The resistance on the $n^-$ layer 4 is increased in proportion to the width of the $n^-$ layer 4 (the distance from the $n^+$ layer 3 to the p type well region 5) if resistivity is the same throughout the $n^-$ layer 4. Accordingly, the thickness of the $n^-$ layer 4 must be decreased so as to reduce the value of the ON-state resistance.

On the other hand, the thicker the $n^-$ layer 4 is, the wider a depletion layer can extend when resistivity is the same throughout the $n^-$ layer 4. Therefore, the thicker the width of the $n^-$ layer 4 is, the higher the breakdown voltage of the field effect transistor 10A becomes. Accordingly, the thickness of the $n^-$ layer 4 must be increased so as to enhance the breakdown voltage of the field effect transistor 10A.

Thus, it should be noted that the thickness of the $n^-$ layer 4 of the field effect transistor 10A must be optimum because it affects the field effect transistor 10A with regard to an electrical characteristic such as an ON-state resistance, breakdown voltage or the like. As to the bipolar transistor 10B, the thickness of the $n^-$ layer 4 must be optimum in view of reducing collector-to-emitter saturation voltage as much as possible and obtaining sufficient breakdown voltage, similarly to the field effect transistor 10A.

Accordingly, it is desired that the thickness of the $n^-$ layer 4 of each of the field effect transistor 10A and bipolar transistor 10B is individually determined or optimized for implementing a desired electrical characteristic of each transistor.

In the above mentioned semiconductor device of an insulation type composite element structure, however, the regions for element formation (i.e., islands) 25 are configured entirely the same. In other words, the thicknesses of the $n^+$ layer 3 in both transistors 10A and 10B are the same. Further, it is not desirable to unnecessarily increase the depth of the p type well region in the transistor 10A because of its influence on the channel length, and the depth of p type base region 13 in the transistor 10B can't be made excessively deep because of its influence on the direct current amplification factor $h_{FE}$. Therefore, the thickness of the n⁻ layer 4 is determined depending on a transistor having a higher breakdown voltage of the transistors 10A and 10B, and as a result, the thickness of the n⁻ layer 4 of another transistor with lower breakdown voltage becomes disadvantageously excessively thick.

SUMMARY OF THE INVENTION

A semiconductor device according to the present invention comprises a semiconductor substrate, first and second semiconductor element forming regions having a predetermined thickness which are formed in the semiconductor substrate with their peripheries enclosed with dielectric layers, and first and second semiconductor elements formed in the first and second semiconductor element forming regions, respectively.

Each of the first and second semiconductor element forming regions comprises a first semiconductor layer of a first thickness formed on the dielectric layer, the first thickness being different between the first semiconductor element forming region and the second semiconductor element forming region, a second semiconductor layer of a second thickness formed on the first semiconductor layer, the second thickness being equal to a difference between the predetermined thickness and the first thickness, and an active layer formed on the second semiconductor layer, the active layer together with the first and second semiconductor layers forming the semiconductor element.

A method of manufacturing a semiconductor device according to the present invention comprises the steps of preparing a semiconductor substrate having first and second major surfaces, forming a plurality of grooves on the first major surface of the semiconductor substrate, regions between any adjacent two of the grooves being defined as semiconductor device forming regions, the semiconductor device forming regions including first and second semiconductor element forming regions, forming a first semiconductor layer on the first major surface of the semiconductor substrate including the grooves, a thickness of the first semiconductor layer being different between the first semiconductor element forming region and the second semiconductor element forming region, forming a dielectric layer on the first semiconductor layer, forming a supporting semiconductor layer on the dielectric layer, isolating the semiconductor substrate and the first semiconductor layer by the dielectric layer for each of the semiconductor element forming regions, by removing the semiconductor substrate by a predetermined thickness from the second major surface to expose a part of the dielectric layer on the second major surface, a portion of the semiconductor substrate as separated in the semiconductor device forming region defining a second semiconductor layer, a thickness of the second semiconductor layer being different between the first semiconductor element forming region and the second semiconductor element forming region in response to a difference of thickness of the first semiconductor layer in the first and second semiconductor element forming regions, and forming an active layer on the second semiconductor layer, the active layer together with the first and second semiconductor layers forming semiconductor element.

According to the present invention, first semiconductor layers are formed in first and second semiconductor element forming regions. Although the first and second semiconductor element forming regions have the same depth, thicknesses of the first semiconductor layers are made different from each other. Accordingly, thicknesses of second semiconductor layers formed on the first semiconductor layers in the first and second semiconductor element forming regions are made different from each other.

Accordingly, it is an object of the present invention to provide a semiconductor device which is capable of forming elements having optimum electrical characteristics within regions for element formation, and a method for manufacturing the same.

These and other objects, features, aspects and advantages of the present invention will become more apparent from the following detailed description of the present invention when taken in conjunction with the accompanying drawings.

DETAILED DESCRIPTION OF THE PREFERRED EMBODIMENT

Figure 3:
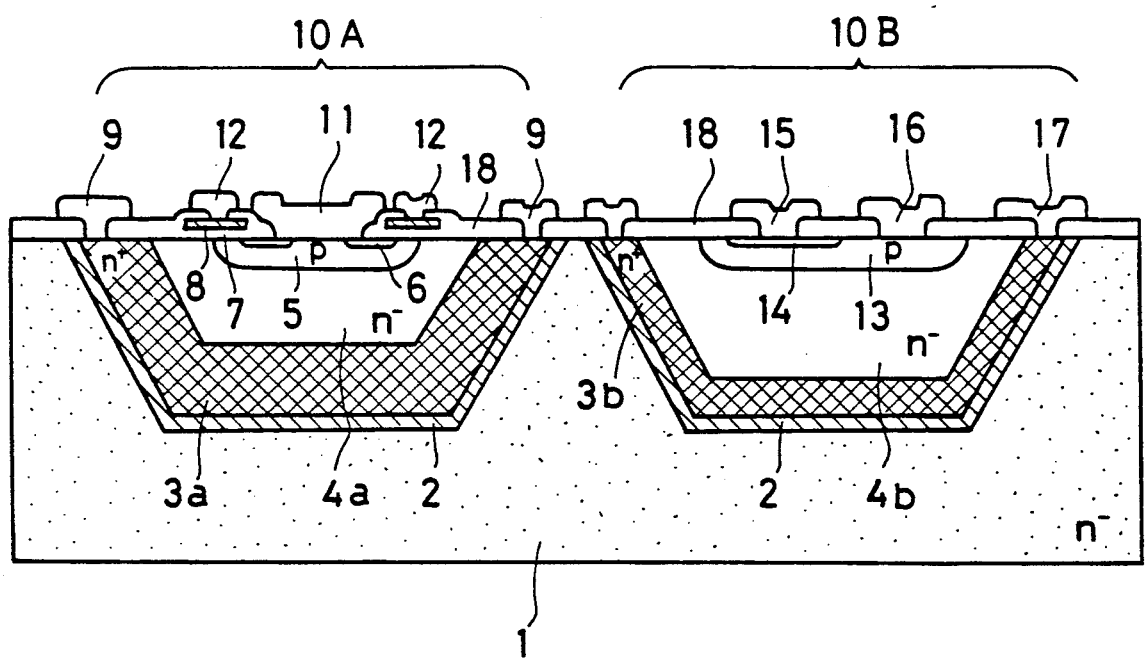
FIG. 3 is a sectional view showing an embodiment of a semiconductor device of isolation type composite element structure according to the present invention.

FIG. 3 is a sectional view showing an exemplary embodiment of a semiconductor device of isolation type composite element structure according to the present invention. As can be seen in FIG. 3, the respective width of n⁻ layers 4a and 4b and the respective thickness of n⁺ layers 3a and 3b are different between a field effect transistor 10A and a bipolar transistor 10B. That is, the width of the n⁻ layer 4b is larger than that of the n⁻ layer 4a, and the thickness of the n⁺ layer 3a is larger than that of the n⁺ layer 3b. The n⁻ layers 4a and 4b have an optimum thickness, respectively, so as to attain desired electrical characteristics for the field effect transistor 10A and the bipolar transistor 10B. Other structures are the same as those of the conventional device, and therefore the description will be omitted.

FIGS. 4A to 4I are sectional views showing steps for forming islands of the semiconductor device shown in FIG. 3. The formation steps will be described below with reference to these figures.

Figure 4A:
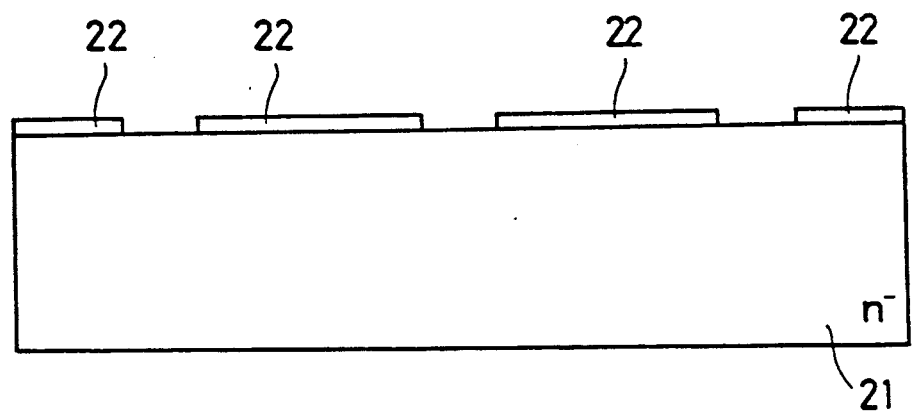
FIGS. 4A to 4I are sectional views showing steps for manufacturing the semiconductor device shown in FIG. 3.
Figure 4B:
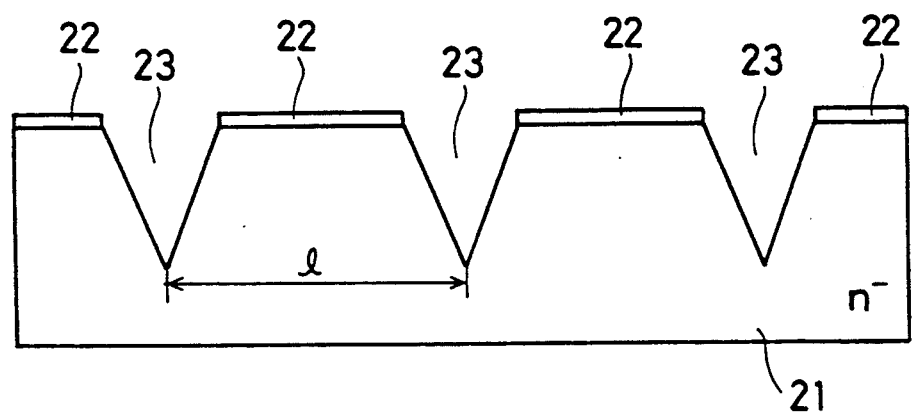

An oxide layer 22 is deposited on the surface of an n⁻ substrate 21 of monocrystal and patterned as shown in FIG. 4A. As shown in FIG. 4B, the n⁻ substrate 21 is anisotropically etched to form V-shaped grooves 23 by using the patterned oxide layer 22 as a mask. A distance l between grooves 23 defines a width between islands.

Figure 4C:
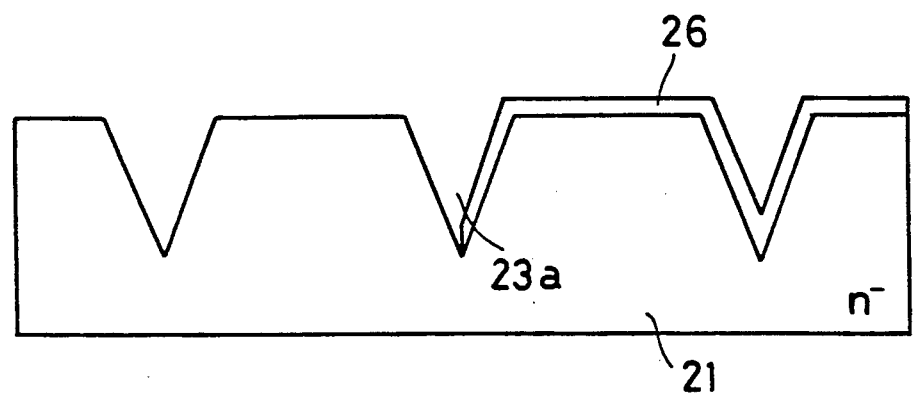
Figure 4D:
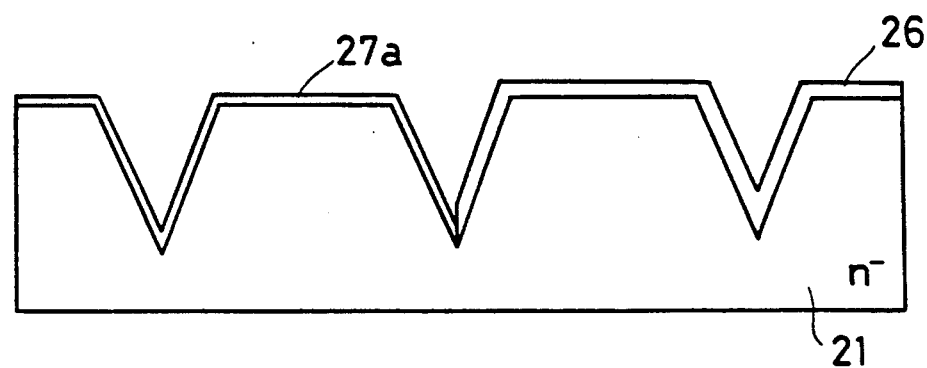

After removing the oxide film 22, an oxide film 26 is formed over the whole surface of the n⁻ substrate 21 by thermal oxidation treatment and then so patterned that the boundary of the oxide film 26 is defined in the groove 23a as shown in FIG. 4C. Then, n-type impurities 27a such as phosphorus which have a relatively large diffusion coefficient are deposited on the n− substrate 21. The impurities 27a are deposited only upon a portion excepting the oxide film 26 as shown in FIG. 4D.

Figure 4E:
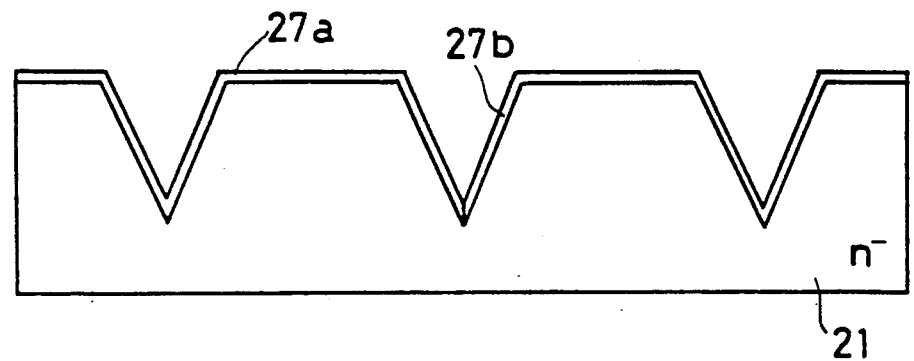

After removing the oxide film 26, n-type impurities 27b as antimony which have a relatively small diffusion coefficient are deposited on the whole n− substrate 21 as shown in FIG. 4E. In this step, very little amount of the impurities 27b are deposited on a portion in which the impurities 27a have been deposited, or substantially no impurities 27b are deposited on this portion.

Figure 4F:
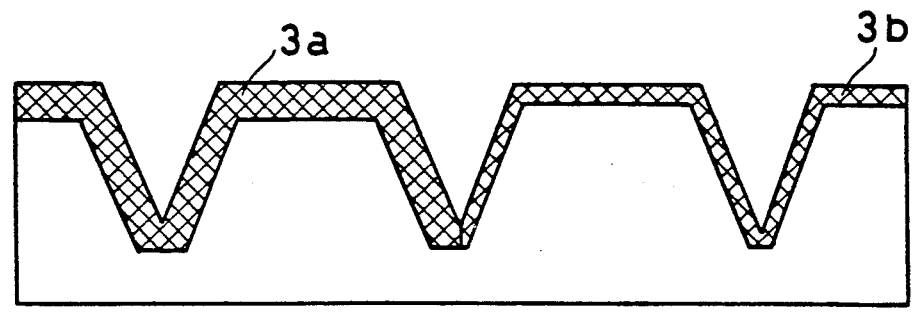

Then the n− substrate 21 is heat treated, so that n+ layers 3a and 3b are formed by diffusion of the impurities 27a and 27b. The diffusion of the impurities 27a results in the n+ layer 3a, and the diffusion of the impurities 27b results in the n+ layer 3b. As shown in FIG. 4F, the n+ layer 3a is thicker than the n+ layer 3b because of the difference of diffusion coefficient between them.

Figure 4G:
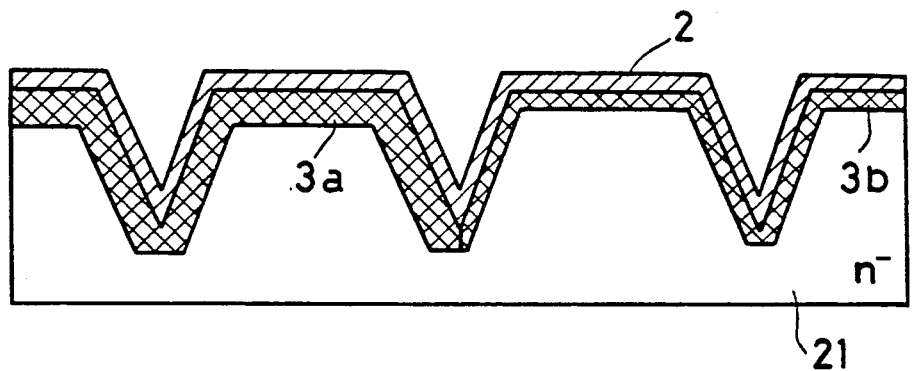
Figure 4H:
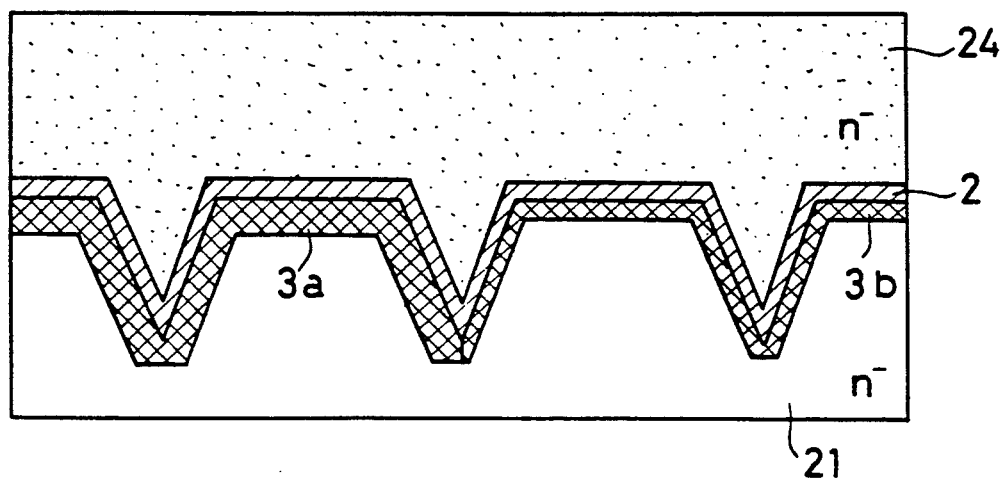

An oxide film 2 is formed on the n+ layers 3a and 3b by means of thermal oxidation or the like as shown in FIG. 4G. An n− polysilicon layer 24 is formed on the insulation film 2 by epitaxial growth technology as shown in FIG. 4H.

Figure 1:
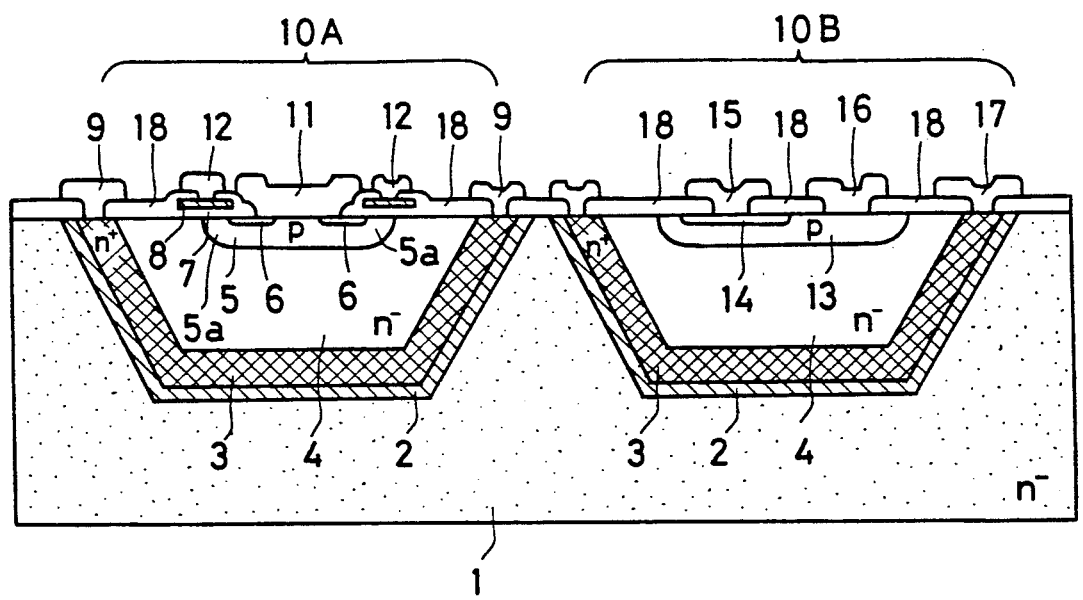
FIG. 1 is a sectional view showing a conventional semiconductor device of isolation type composite element structure.
Figure 2A:
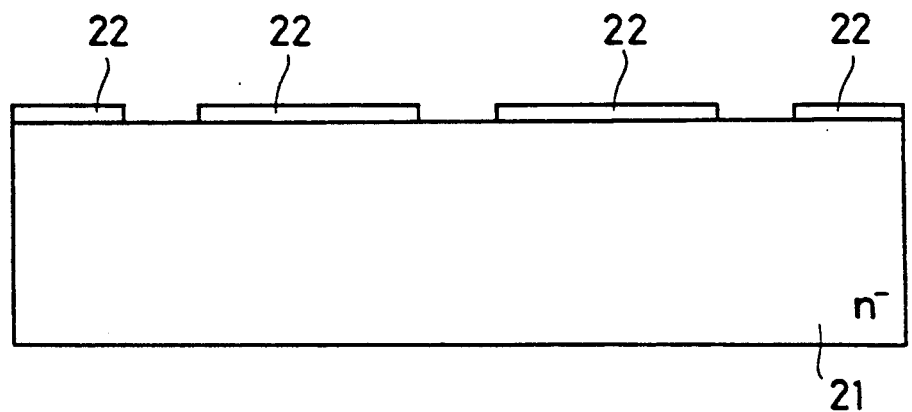
FIGS. 2A to 2F are sectional views showing steps for manufacturing the semiconductor device shown in FIG. 1.
Figure 2B:
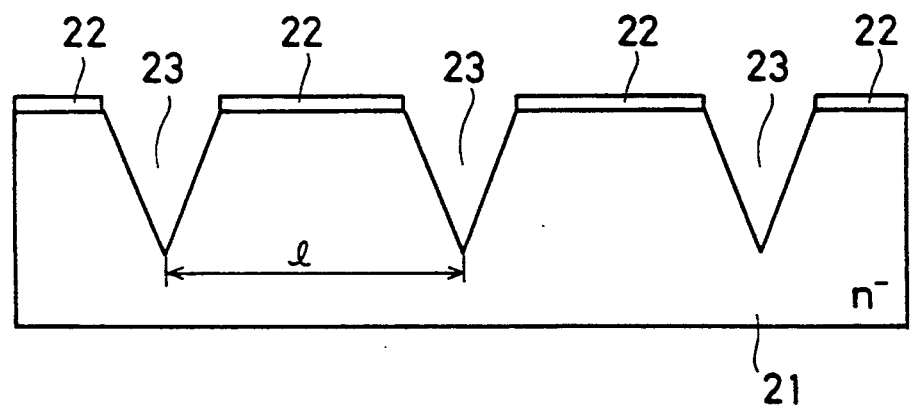
Figure 2C:
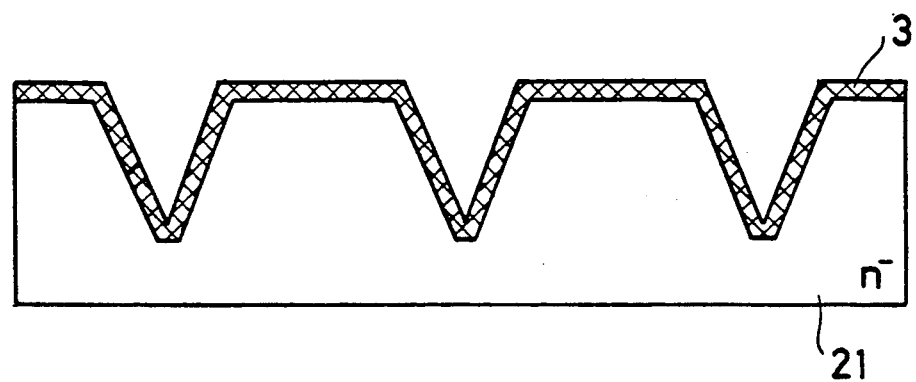
Figure 2D:
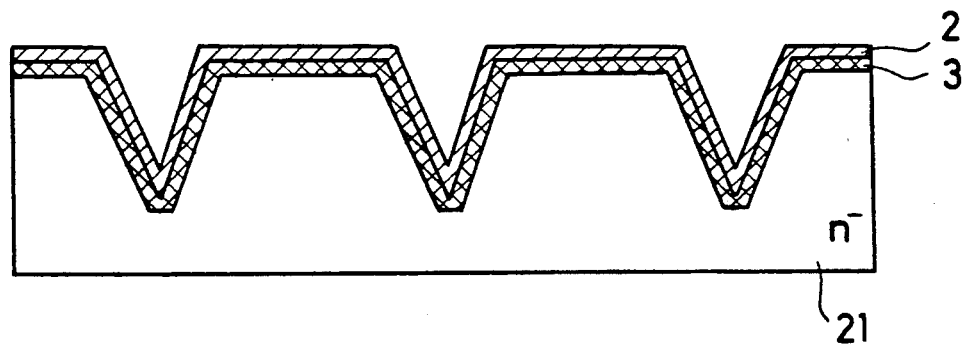
Figure 2E:
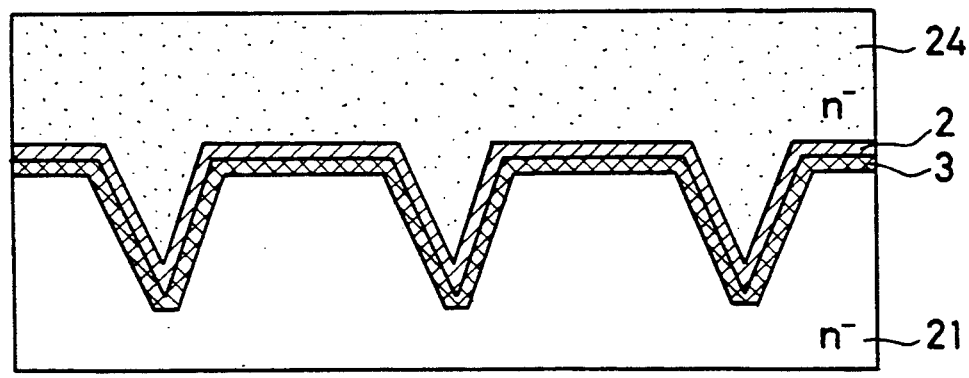
Figure 2F:
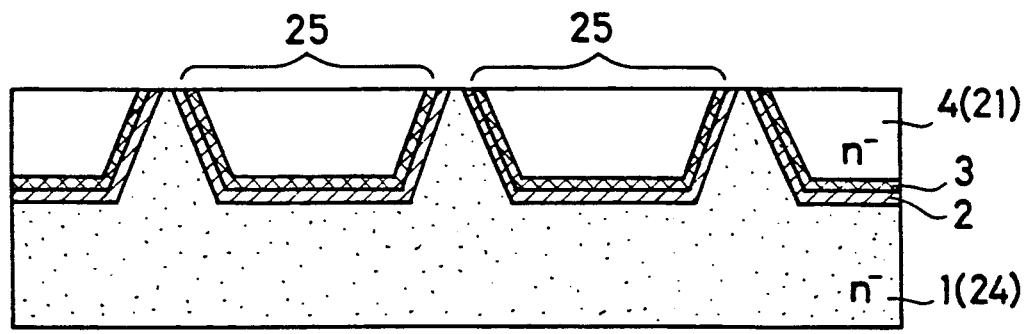
Figure 4I:
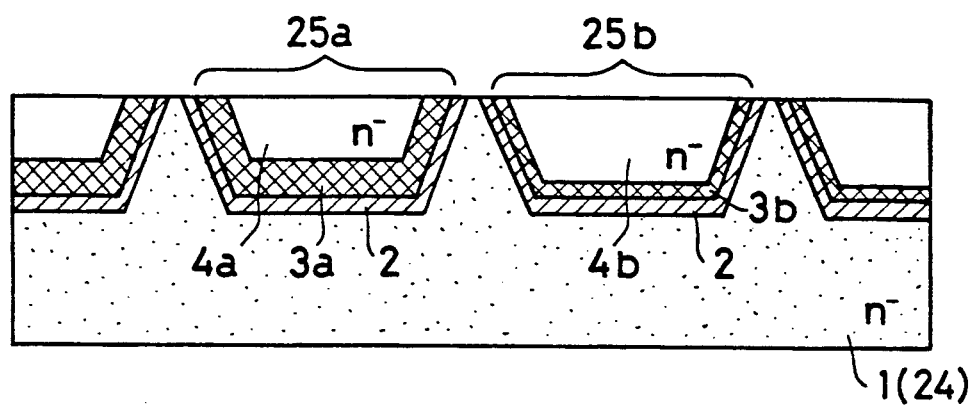

Then the bottom surface of the n− substrate 21 is polished to expose the n+ layers 3a and 3b on the bottom surface of the n− substrate 21. Turning the n− substrate 21 upside down, a plurality of islands 25 are formed on the layer 24 as shown in FIG. 4I. The n− polysilicon layer 24 corresponds to the n− polysilicon substrate 1 in FIG. 1. Remaining parts of the n− substrate 21 corresponds to the n− layers 4 in FIG. 1. The islands 25 are insulated by the insulation film 2. The n+ layer 3a of the island 25a is thicker than the n+ layer 3b of the island 25b. Accordingly, the n− layer 4a of the island 25a is thinner than the n− layer 4b of the island 25b.

The field effect transistor 10A and the bipolar transistor 10B such as in FIG. 3 are manufactured in the islands 25a and 25b thus obtained, respectively, by the following steps. FIGS. 5A to 5D are sectional views showing steps for manufacturing the field effect transistor 10A and the bipolar transistor 10B. The manufacturing steps will be described below with reference to these figures.

Figure 5A:
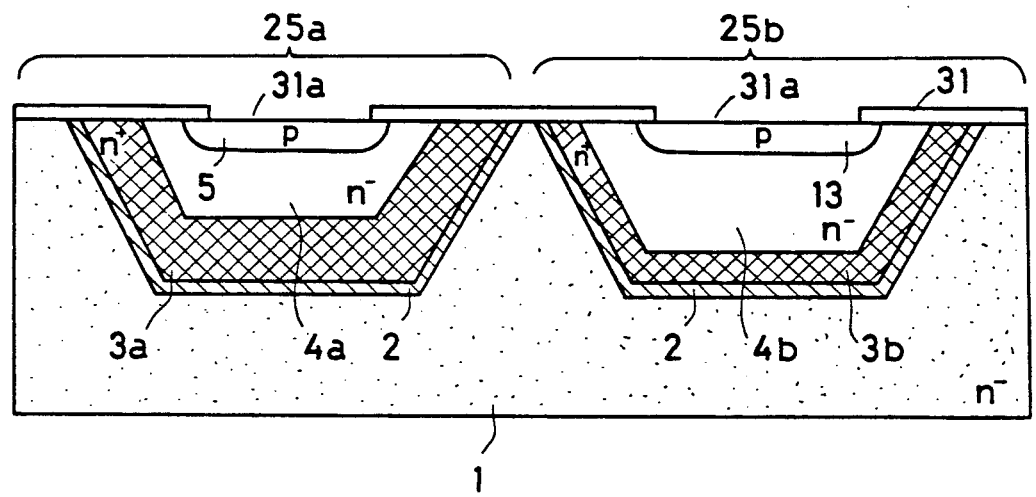
FIGS. 5A to 5D are sectional views showing steps for manufacturing a field effect transistor and a bipolar transistor.

The n− polysilicon substrate 1 is treated with hydrofluoric acid contained chemical. After that, an oxide film 31 is formed on the n− polysilicon substrate 1 by means of thermal oxidation or the like. The oxide film 31 is selectively patterned by photolithography technology to form windows 31a. Impurities are diffused through the window 31a of the oxide film 31, so that a p type well region 5 is formed on the upper portion of the n− layer 4a of the island 25a and a p type base region 13 is formed on the upper portion of the n− layer 4b of the island 25b, as shown in FIG. 5A.

Figure 5B:
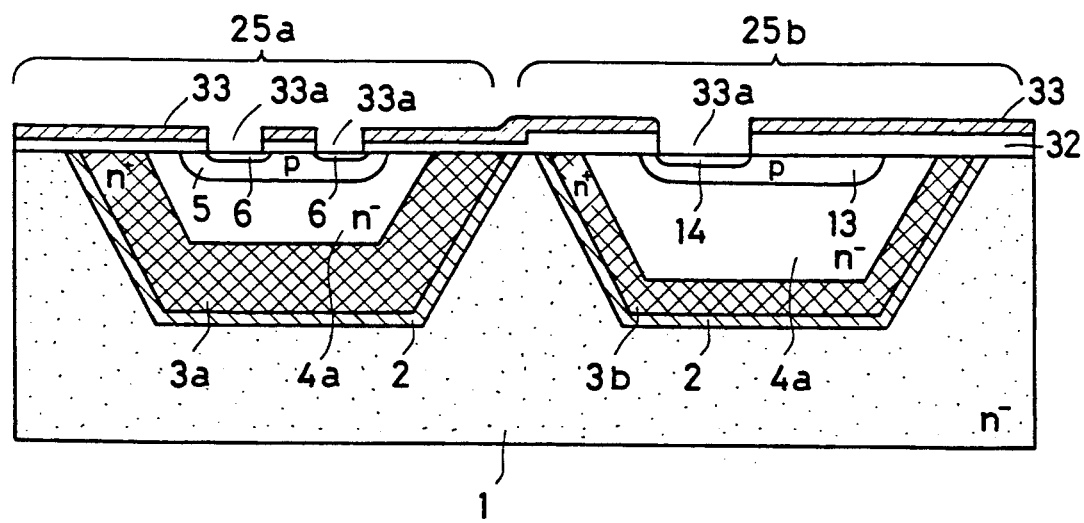

The oxide film 31 in the island 25a is removed, and then a thin oxide film 32 is formed on the surface of the n− epitaxial substrate 1 by means of thermal oxidation or the like. A polysilicon layer 33 is formed on the oxide film 32. The oxide film 32 in the island 25b becomes a little thicker than in the island 25a because it is united with the oxide film 31. Then, windows 33a are formed by selectively etching the polysilicon layer 33 and the oxide film 32. Further, as shown in FIG. 5B, n-type impurities are diffued through windows 33a of the polysilicon layer 33, so that n+ source regions 6 and an n+ emitter region 14 are formed on the upper portion of the p type well region 5 and p base region 13, respectively.

Figure 5C:
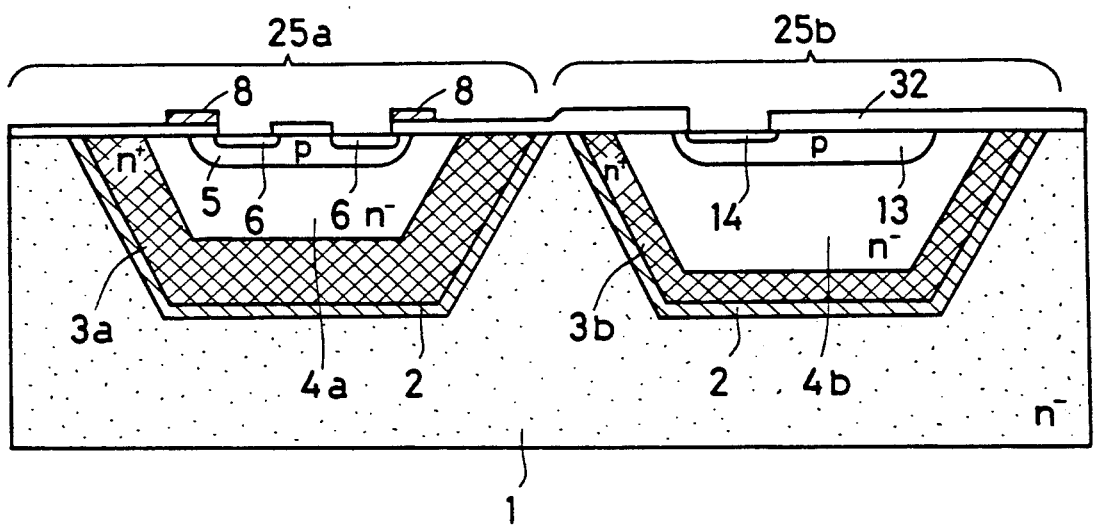
Figure 5D:
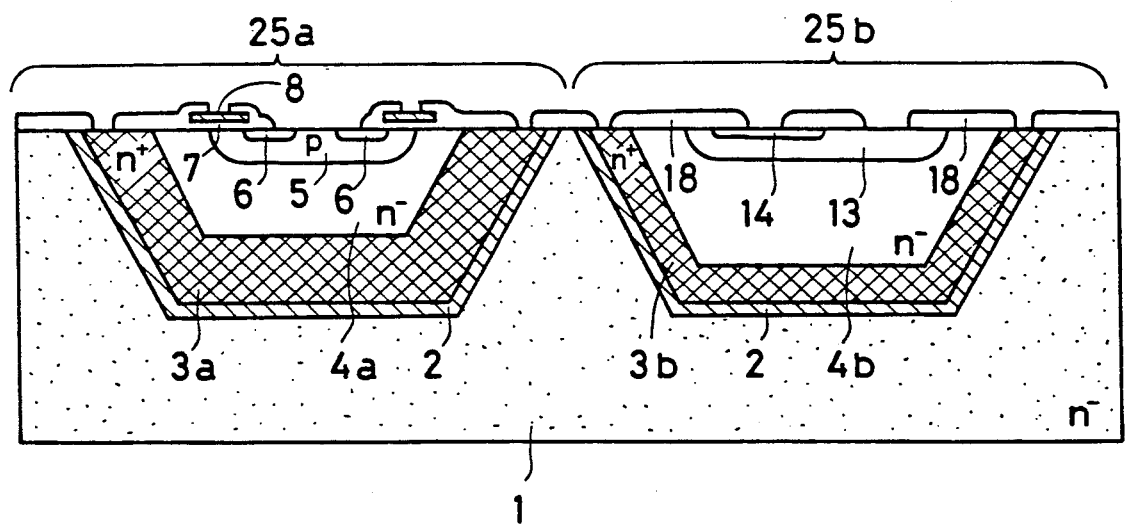

The polysilicon layer 33 is selectively etched to form a polysilicon gate 8 in the island 25a as shown in FIG. 5C. Then, an oxide film is formed over the whole surface of the n− epitaxial substrate 1. A passivation film 18 is formed in the islands 25a and 25b by selectively etching this oxide film, as shown in FIG. 5D.

Further, a conductive layer is formed on the n− epitaxial substrate 1 including the passivation film 18. By selectively etching this conductive layer, as shown in FIG. 3, a drain electrode 9, a source electrode 11 and a gate electrode 12 are formed in the island 25a, and an emitter electrode 15, a base electrode 16 and a collector electrode 17 are formed in the island 25b. Thus, the field effect transistor 10A is formed in the island 25a and the bipolar transistor 10B is formed in the island 25b.

In the above embodiment, by making the thickness of the n+ layers 3a and 3b formed in the islands 25a, 25b different, the thickness of the n− layers 4a and 4b upon them can be made different. Therefore, the drain width (the width of the n− layer 4a) of the transistor 10A and the collector width (the width of the n− layer 4b) of the transistor 10B can be made different. Thus, by independently optimizing the respective widths of the n− layers 4a and 4b, both the field effect transistor 10A and the bipolar transistor 10B can take desired electrical characteristics.

Also, a p− substrate can be employed instead of the n− substrate 21. In this case, p+ layers are formed in different thickness from each other instead of the n+ layers 3a, 3b, and semiconductor elements of which polarity is reversed from the above embodiment are formed in the islands 25.

Furthermore, it is possible that after the impurities 27b having a relatively small diffusion coefficient are deposited, the impurities 27a having a relatively large diffusion coefficients are deposited. However, the oxide film 26 must be patterned so that the oxide film 26 is left on the left portion of the n− substrate 21 in FIG. 4C, in order to form the islands 25a and 25b in the same arrangement as in the above embodiment.

Figure 6A:
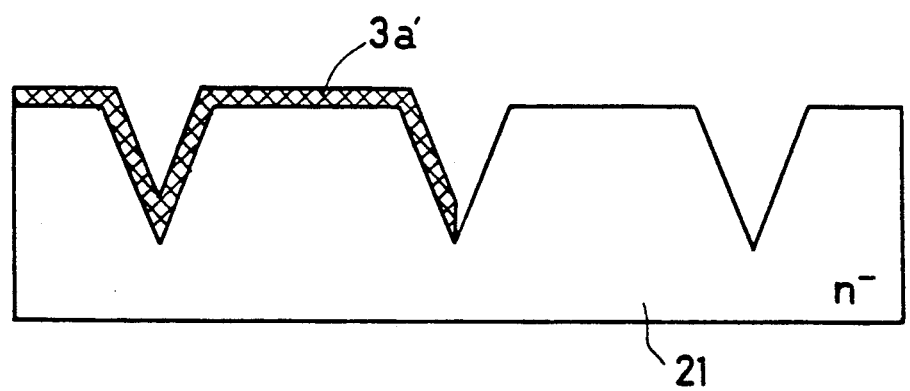
FIGS. 6A and 6B are sectional views showing other steps for manufacturing the semiconductor device shown in FIG. 3.
Figure 6B:
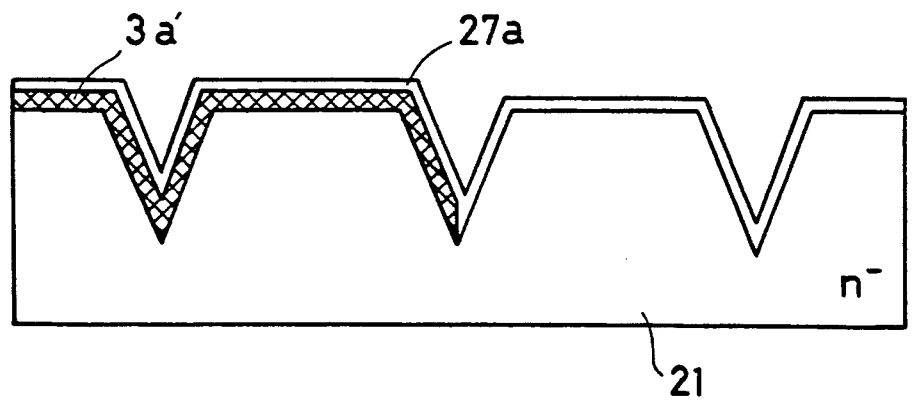

Further, the n+ layers 3 may be formed in different thickness from each other with only one kind of impurity by the steps shown in FIGS. 6A and 6B which will be described below: After the step shown in FIG. 4D, the step shown in FIG. 6A is entered. In this step, an impurities 27a is diffused to form an n+ layer 3a', which is a portion of an n+ layer 3a, and an oxide film 26 is removed. Then, the same kind of impurities 27a are deposited again over all the surface of an n− substrate 21 as shown in FIG. 6B. After this step, the step shown in FIG. 4F is entered. That is, the impurities 27a is diffused to form n+ layers 3a and 3b which is different in thickness since an effective diffusion time is different between these n+ layers 3a and 3b. After that, processing is taken part in accordance with the steps shown in FIGS. 4G to 4I.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:
   preparing a semiconductor substrate having first and second major surfaces;
   forming a plurality of grooves on said first major surface of said semiconductor substrate, regions between any adjacent two of said grooves being defined as semiconductor device forming regions, said semiconductor device forming regions including first and second semiconductor element forming regions;
   forming a first semiconductor layer on said first major surface of said semiconductor substrate including said grooves, a thickness of said first semiconductor layer being different between said first semiconductor element forming region and said second semiconductor element forming region, wherein said step of forming said first semiconductor layer comprises the steps of:
      depositing a first impurity of a predetermined conductivity type having a first diffusion coefficient on said first major surface of said semiconductor substrate including said grooves in said first element forming region;
      depositing a second impurity of said predetermined conductivity type having a second diffusion coefficient different from said first diffusion coefficient on said first major surface of said semiconductor substrate including said grooves in said second element forming region; and
      diffusing said first and second impurities to form said first semiconductor layer.
   forming a dielectric layer on said first semiconductor layer;
   forming a supporting semiconductor layer on said dielectric layer;
   isolating said semiconductor substrate and said first semiconductor layer by said dielectric layer for each of said semiconductor element forming regions, by removing said semiconductor substrate by a predetermined thickness from said second major surface to expose a part of said dielectric layer on said second major surface, a portion of said semiconductor substrate as separated in said semiconductor device forming region defining a second semiconductor layer, a thickness of said second semiconductor layer being different between said first semiconductor element forming region and said second semiconductor element forming region in response to a difference of thickness of said first semiconductor layer in said first and second semiconductor element forming regions; and
   forming an active layer on said second semiconductor layer, said active layer together with said first second semiconductor layers forming semiconductor elements.

2. A method of manufacturing a semiconductor device, comprising the steps of:
   preparing a semiconductor substrate having first and second major surfaces;
   forming a plurality of grooves on said first major surface of said semiconductor substrate, regions between any adjacent two of said grooves being defined as semiconductor device forming regions, said semiconductor device forming regions including first and second semiconductor element forming regions,
   forming a first semiconductor layer on said first major surface of said semiconductor substrate including said grooves, a thickness of said first semiconductor layer being different between said first semiconductor element forming region and said second semiconductor element forming region, wherein said step of forming said first semiconductor layer comprises the steps of:
      depositing a first impurity on said first major surface of said semiconductor substrate including said grooves in said first semiconductor element forming region, diffusing said first impurity to form a portion of said first semiconductor layer;
      depositing a second impurity which is the same as said first impurity on said first major surface of said semiconductor substrate including said grooves in said first and second semiconductor element forming regions; and
      diffusing said second impurity to complete said first semiconductor layer;
   forming a dielectric layer on said first semiconductor layer;
   forming a supporting semiconductor layer on said dielectric layer;
   isolating said semiconductor substrate and said first semiconductor layer by said dielectric layer for each of said semiconductor element forming regions, by removing said semiconductor substrate by a predetermined thickness from said second major surface to expose a part of said dielectric layer on said second major surface, a portion of said semiconductor substrate as separated in said semiconductor device forming region defining a second semiconductor layer, a thickness of said second semiconductor layer being different between said first semiconductor element forming region and said second semiconductor element forming region in response to a different of thickness of said first semiconductor layer in said first and second semiconductor element forming regions; and
   forming an active layer on said second semiconductor layer, said active layer together with said first and second semiconductor layers forming semiconductor elements.

3. A method of manufacturing a semiconductor device in accordance with claim 1, wherein said step of forming said first semiconductor layer the first and second impurities are simultaneously diffused to form said first semiconductor layer.

4. A method of manufacturing a semiconductor device in accordance with claim 1, wherein
   said step of forming a supporting semiconductor layer includes the step of epitaxially growing said supporting semiconductor layer.

5. A method of manufacturing a semiconductor device in accordance with claim 1, wherein
   said step of isolating includes the step of polishing said semiconductor substrate from said second major surface to remove said semiconductor substrate by said predetermined thickness.

6. A method of manufacturing a semiconductor device in accordance with claim 1, wherein
   said semiconductor element in said first semiconductor element forming region includes a bipolar transistor and said semiconductor element in said second semiconductor element forming region includes a field effect transistor.

* * * * *